United States Patent [19]
Jackson et al.

[11] Patent Number: 6,029,718
[45] Date of Patent: Feb. 29, 2000

[54] CHEMICAL DELIVERY SYSTEM EMPLOYING CONTAINMENT CRATE

[75] Inventors: Robert M. Jackson, Burnet; Craig Esser, Austin, both of Tex.; Eric Serdahl, Mountain View, Calif.; John N. Gregg, Marble Falls, Tex.

[73] Assignee: Advanced Delivery & Chemical Systems, Ltd., Austin, Tex.

[21] Appl. No.: 09/105,423

[22] Filed: Jun. 26, 1998

Related U.S. Application Data

[60] Provisional application No. 60/052,219, Jul. 11, 1997.

[51] Int. Cl.⁷ ........................................................ B65B 1/04
[52] U.S. Cl. ........................... 141/231; 141/4; 108/57.15; 206/386; 206/499; 280/47.34
[58] Field of Search .................................. 141/231, 232, 141/233, 18, 4, 5, 98; 206/386, 598, 499; 312/311, 293.2; 108/51.11, 57.13, 57.15, 57.17; 414/607; 280/33.991, 47.34, 47.35, 79.11, 79.2, 79.7

[56] References Cited

U.S. PATENT DOCUMENTS

| | | | |
|---|---|---|---|
| 4,344,368 | 8/1982 | Remington et al. | 108/57.15 |
| 4,930,661 | 6/1990 | Voorhies | 206/386 |
| 4,976,365 | 12/1990 | Seo | 206/386 |
| 4,986,292 | 1/1991 | Rieple | 141/231 |
| 5,465,766 | 11/1995 | Siegele et al. | 141/198 |
| 5,497,316 | 3/1996 | Sierk et al. | 364/140 |
| 5,562,132 | 10/1996 | Siegele et al. | 141/198 |
| 5,590,695 | 1/1997 | Siegele et al. | 141/21 |
| 5,607,002 | 3/1997 | Siegele et al. | 141/198 |
| 5,711,354 | 1/1998 | Siegele et al. | 141/198 |
| 5,845,914 | 12/1998 | Lenkman | 280/43.17 |

OTHER PUBLICATIONS

Schumacher, Announcing a new era in liquid chemical delivery Transfill II, Plublication, 1991.

*Primary Examiner*—Henry J. Recla
*Assistant Examiner*—Tuan Nguyen
*Attorney, Agent, or Firm*—O'Keefe, Egan & Peterman

[57] ABSTRACT

This invention concerns a shipping and containment cart, comprising: a base having three sides and one or more doors attached thereto, wheels attached to the base, a top attached to the sides having a tank hole, wherein the base, sides, and doors have been attached to provide a sealed compartment. This invention also concerns a chemical delivery cabinet, comprising: a base, three sides, and one or more doors attached to one or more sides, a valve manifold affixed to an inner wall of the cabinet, process control instrumentation which connects to and controls the valve manifold, wherein at least one of the doors has a touch control pad mounted thereon. This invention is also a chemical refill system, comprising a canister housed in a transportation cart, wherein the cart comprises a base having three sides and one or more doors attached thereto, wheels attached to the base, a top attached to the sides having a canister hole, wherein the top has been fastened to the sides such that the canister hole fits over a vertical sheath on the canister, wherein the base, sides, and doors have been attached to provide a sealed compartment. In one embodiment of this invention, the system is been placed in the chemical delivery cabinet.

17 Claims, 3 Drawing Sheets

CHEMICAL DELIVERY SYSTEM EMPLOYING CONTAINMENT CRATE

This application claims priority to U.S. Provisional Application Ser. No. 60/052,219 filed Jul. 11, 1997.

BACKGROUND OF INVENTION

This invention relates to shipping crates for chemicals such as tetraethylorthosilicate ("TEOS") which is used in integrated circuit fabrication.

In the semiconductor industry, a variety of chemicals are employed during the fabrication of integrated circuits. For example, TEOS is widely used as a feed stock to a plasma enhanced reactor which forms silicon dioxide layers. Such chemicals are often shipped in bulk delivery tanks, including 200 liter canisters. When filled, these tanks can be quite heavy and may weigh 600 pounds or more. As a result, forklifts have previously been used to move filled tanks, including use of forklifts to place a filled canister in a storage and delivery cabinet. However, use of a forklift is prone to difficulties, such as potential rupture of the vessel, difficulty of loading tanks in narrow walkways, lack of access in cleanrooms, and so forth.

In addition, the tanks have been housed in delivery cabinets. The delivery cabinets include hardware attached to the tanks for withdrawing chemicals from the tanks and sending the withdrawn chemicals to a delivery point, typically a smaller delivery canister. Prior cabinets functioned as containment vessels. The cabinets have heretofore been oversized so that a spill may collect in the bottom of the cabinet. For instance, a grating is typically installed to act as a false floor, with the tank resting on the grating. The grating permits liquid spills to run into the reservoir in the bottom of the cabinet. A chemical spill in a conventional cabinet is, however, problematic for several reasons. For instance, the cabinet itself must be taken off line so that it can be cleaned. As a result, supply of chemical from the contaminated cabinet is foreclosed during clean-up. Such down time of the supply cabinet may result in temporary shut down of the process equipment utilizing the cabinet for chemical supply. For large, bulk cabinets, up to 30 systems could be potentially be down, which would be very costly event during integrated circuit fabrication.

Furthermore, because the cabinet is oversized as protection in the event of a spill, the cabinets may take up more space than would otherwise be desirable. Space is valuable in any fabrication operation. Hence, a system which enables containment of spills but which has a smaller size would be highly desirable. Likewise, since prior bulk cabinets included the aforementioned grating, the bulk tanks needed to be lifted for placement in the cabinet.

SUMMARY OF INVENTION

The present invention provides a solution to one or more of the disadvantages and deficiencies described above. In particular, this invention provides a combination shipping/containment cart. The shipping cart (or "crate" having wheels) of this invention facilitates use of a storage and delivery cabinet of reduced size in comparison to conventional cabinets used in the semiconductor industry. One significant advantage to this invention is that the cart of this invention provides a movable, wheeled vehicle that may be transported readily into narrow, crowded chemical storage areas, and into cleanroom areas.

In one broad respect, this invention is a shipping cart, comprising: a base having four sides, wheels attached to the base, a top attached to the sides having a tank hole, wherein the base and sides have been attached to provide a sealed compartment.

In another broad respect, this invention is a chemical refill system, comprising a tank housed in a cart, wherein the cart comprises a base having four sides that define a sealed compartment, wheels attached to the base, a top attached to the sides having a tank hole, wherein the top has been fastened to the sides such that the tank hole fits over a vertical sheath on the tank. In one embodiment of this invention, the system is placed in the chemical delivery cabinet.

In another broad respect, this invention is a chemical delivery cabinet, comprising: a base, three sides, and one or more doors attached to one or more sides, a valve manifold affixed to an inner wall of the cabinet, process control instrumentation which connects to and controls the valve manifold, wherein at least one of the doors has a touch control pad mounted thereon.

In yet another broad respect, this invention is a process useful for supplying a refill tank, comprising: providing a cart which comprises a base having four sides, wheels attached to the base, a top attached to the sides having a tank hole, wherein the top has been fastened to the sides such that the tank hole fits over a vertical sheath on the tank, wherein the base and sides have been attached to provide a sealed compartment; providing a tank; placing the tank in the cart with the tank hole fitting over a vertical sheath of the tank; filling the tank with a liquid chemical before or after placing the tank in the cart.

This invention has a number of advantages. For example, the shipping cart of this invention facilitates easy maneuvering and installation of a filled tank in a refill cabinet. Advantageously, the shipping cart may even be maneuvered into a cleanroom. Hence, widened aisles and the like previously required in order to place a refill tank in a refill cabinet are rendered unnecessary in view of this invention. Advantageously, the shipping container is adapted to function as a self-containment vessel in the event of a chemical leak or spill from the tank. More advantageously, since the shipping crate functions as a self-containment vessel, the cabinet housing the valve manifold and lines can be reduced in size, thereby saving space in a manufacturing operation. Furthermore, if a spill or leak should occur, the tank may be readily drained and changed out by simply withdrawing the shipping crate from the cabinet, and installing a new crate, thereby effectively eliminating down time in the manufacturing process.

DETAILED DESCRIPTION OF THE INVENTION

Figure 1:
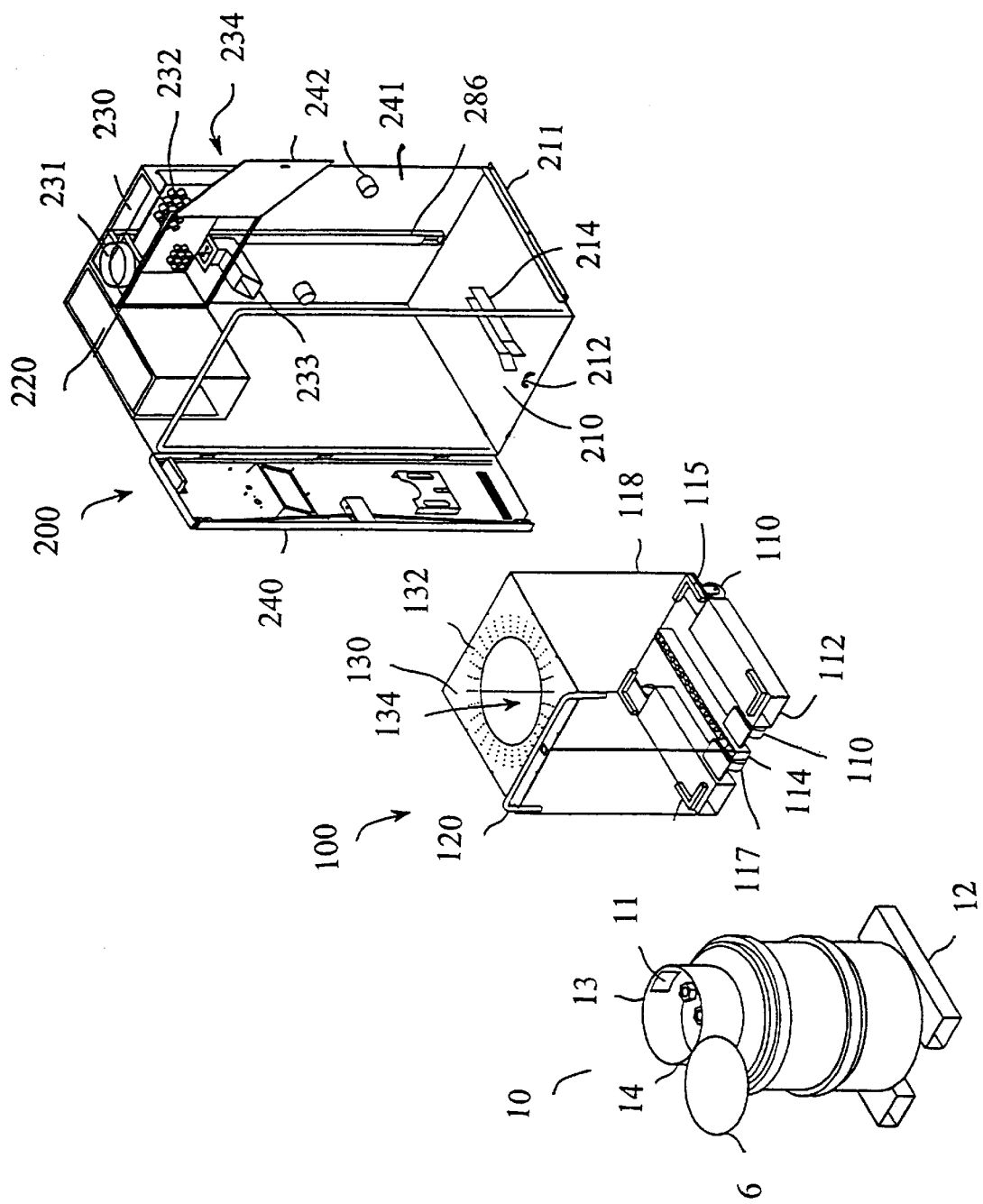
FIG. 1 shows a tank, a shipping cart, and a cabinet of this invention.

FIG. 1 shows a bulk delivery system representative of the present invention. The system includes bulk chemical tank 10, a mobile containment shipping cart 100, and a bulk chemical cabinet 200 to house tank 10 and crate 100. In practice, tank 10 may be placed in cart 100 by lifting it using an overhead crane or the like when appropriate holds are on the tank 10.

The canister 10, which may also be variously referred to as a canister or storage vessel, may be of a wide variety of sizes, with a 200 liter size being especially applicable for use in the practice of the present invention. The canisters may be of conventional design and/or designed for a particular use, and in general are adapted to contain and provide a liquid chemical. These canisters are typically made from stainless steel, with or without a liner. Canister 10 includes fittings 13 by which lines (not shown) may be connected so that the chemicals can be delivered from the canister while maintaining a very high purity. The canister 10 may include internal lines (not shown) to the bottom, as well as sensors to detect the level of chemicals in the tank 10. The canister (or "tank") 10 may include internal lines (not shown) that extend to the bottom of the canister, as well as one or more sensors (up to a dozen sensors may be employed) to detect the level of chemicals in the canister 10). The sensors can be a vapor sensor, a liquid sensor, or both. In addition, canister 10 includes a hole 11 in vertical sheath 14 for receiving scoop 233, described below. It should be appreciated that the particular fittings 13 employed may vary widely, and simply need to be matched with appropriate fittings of lines emanating from valve manifold 230. Canister 10 may also include sleeves 12 which may be welded to the tank 10, or which may be simply placed under canister 10 to be held in place when at rest by the weight of tank 10. The sleeves 12 may be appropriately designed to receive the forks of a forklift. The cart may include a locking device to secure the cart firmly into the cabinet once it is in place. Lid 6 may be used to protect the fittings during storage or shipping.

One or more pressure transducers may be added on a spare port of the canister to allow for pressure management control to keep an inlet valve for helium or the like closed during operation and to only open when the volume is down. Redundant transducers may be used.

As shown in FIG. 1, movable cart 100 includes wheels (rollers) 110, attached to base 116, which may be of appropriate size and suitably durable depending on the size of the tank 10. The wheels 110 may include brakes, including a parking brake or deadman's brake. Cart 100 may include sleeves 112, as part of or attached to base 116, to receive forks of a forklift, for example. The cart 100 may include a drain line for facilitating removal of at least a portion of a liquid spill prior to removing a cart 100 from a cabinet 200. Cart 100 may include guide 114 which aligns with guide 214 in the cabinet 200 to facilitate alignment of the crate 100 as it is positioned into cabinet 200. The guide 114 may be a part of or attached to base 116, and may be secured to base 116 using conventional methods (e.g., using screws or bolts, or by welding). Alternatively, the guide 114 may be designed as a rail, for example, which is attached to the one or more sides of the cart 100, with complimentary guides attached to appropriate positions on the sides of the cabinet. In another alternative, the guides may be spring-loaded ball bearing tracks which snap into position when the cart is in correct alignment, as would be readily apparent to one of skill in the art.

Also attached to base 116 are four exterior walls 118. Optionally, the base may be appropriately fitted and/or equipped with gasket material to seal the cart 100 against leakage if a chemical spill occurs. Typically, the base and sides are welded together or seamless sidewalls are used. The base may be angled, grooved, or the like toward the sensor 117. Similarly, the base may optionally include a low volume trough to collect small spills, thereby enhancing the ability of the sensor 117 to detect such small spills. Alignment guides may include an exhaust duct to provide ventilation for vapor which is denser than air. The cart 100 may include an exhaust duct to provide ventilation for vapor which is denser than air. Handle 120 may be optionally secured to crate 100 to assist an operator in maneuvering crate 100. The top 130 of crate 100 may include an appropriate sized hole 134 to accommodate the top of tank 10. It is preferred that hole 134 be dimensioned so that top 130 snugly fits to assist in securing tank 10 within cart 100 during shipping and movement. Top 130 may also be perforated with holes 132. The holes 132 serve to allow a leak in the upper portion of tank 100 to drain into the lower portion of cart 100. Additionally, a removable part may be used which seals the fitting from exposure to the environment, which may be beneficial when the canister is being placed in a cleanroom for use. This would protect against accumulation of dust and the like on and in the cart and canister. In addition, sensor 117 may be included to sense liquid spills. The sensor may be connected to a controller which may signal an operator or shut down the system in the case of a detected spill. It is currently recommended in the industry that the volume of a containment unit be at least 110% of the volume of tank 10. Accordingly, in one embodiment of this invention, the cart 100 is constructed such that it has a capacity of at least 110% of the internal volume of the tank 10 which cart 100 is designed to house.

Cabinet 200 includes three sides 241, a base 210, door(s) 240, and a top. One or more brace 211 may be attached to support to the structure, as by bolting to the floor where the cabinet is housed. Alternatively, the brace may be replaced by use of holes in the cabinet base for sewing the base of the cabinet directly to the floor, thereby reducing the foot print of the cabinet. One or more doors may be used. When two doors are employed, door stop 212 may be included. The cabinet may include a compartment 220 (or "control box") for installation of process control instrumentation. Alternatively, the process control instrumentation may be situated outside the cabinet. Process control instrumentation is well known and available from various commercial sources, such as Omron, Inc. The process control instrumentation may be connected to touch screen 243 illustrated in FIG. 2.

The cabinet may include a valve manifold 230 having a given number of valves 232 (e.g., pneumatically actuated valves), such as described in U.S. Pat. Nos. 5,465,766; 5,562,132; 5,590,695; 5,607,002; and 5,711,345, or in U.S. patent application Ser. No. 08/893,913 filed Jul. 11, 1997, or in U. S. patent application Ser. No. 60/057,262, filed Aug. 29, 1997 entitled IMPROVED REFILL SYSTEM AND MANIFOLD by Robert Jackson, all of which are incorporated herein by reference. The manifold may be advantageously designed such that there are no un-purged dead legs in the manifold, lines, and fittings. In this regard, the design may advantageously include no bends in tubing interconnection lines and no flex lines. In general, pressure in the system is adjusted so that pressure on the upstream side is higher than the downstream side. Valves 232 may be controlled using process control instrumentation housed in control box 220. It should be appreciated that a wide variety of valves may be used, including but not limited to manually activated valves, pneumatically activated valves, or any other type of valve that enables appropriate flow of gas and liquid through the system. A manifold door 234 may be included to close off valve manifold. Scoop 233 may be included in cabinet 200 from which manifold lines may be placed. The scoop 233 may be appropriately dimensioned to fit into hole 11 of tank 10. The scoop may also be sized to allow adequate exhaust flow. The scoop 233 may thus contain the entire flow of exhaust in the cabinet and can be adjusted for proper balancing. The scoop may also serve the function of directing any liquid spills in the manifold area down to the cart 100 which provides containment. A tube 286 is also shown in FIG. 1 which has a vent opening bottom portion, with the tube being tied into the exhaust to thereby allow for adjustment and balancing of exhaust flow through the cabinet. Cabinet may also include exhaust outlet 231. Optionally, bumpers 242 may be attached on the rear side of cabinet 200 to act as stops for crate 100.

Figure 2:
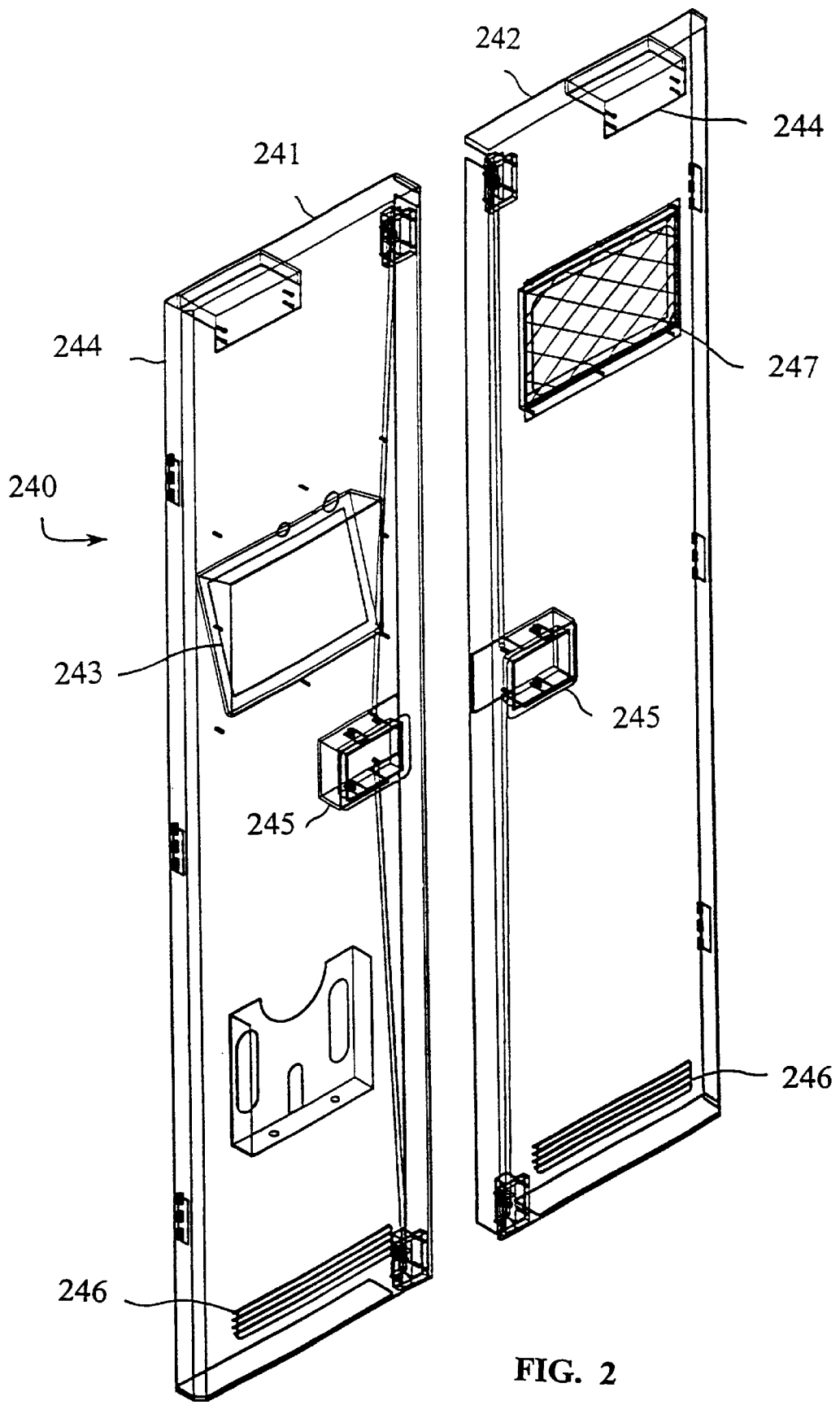
FIG. 2 shows a door used in the cabinet of this invention.

FIG. 2 shows a dual door system for use as door(s) 240 in cabinet 200 in FIG. 1. In FIG. 2, left door 242 and right door 241 are depicted with the side interior to the cabinet 200 being shown. Each door may include spring loaded hinges 244 to mount each door to cabinet 200, door locks 245, and vents 246. While FIG. 2 depicts a dual door system, one or more doors may be optionally used. In addition, door 241 may include touch screen 243 which connects to process control instrumentation, as described above. The touch screen 243 may serve to allow an operator to observe or change the process configuration.

Figure 3:
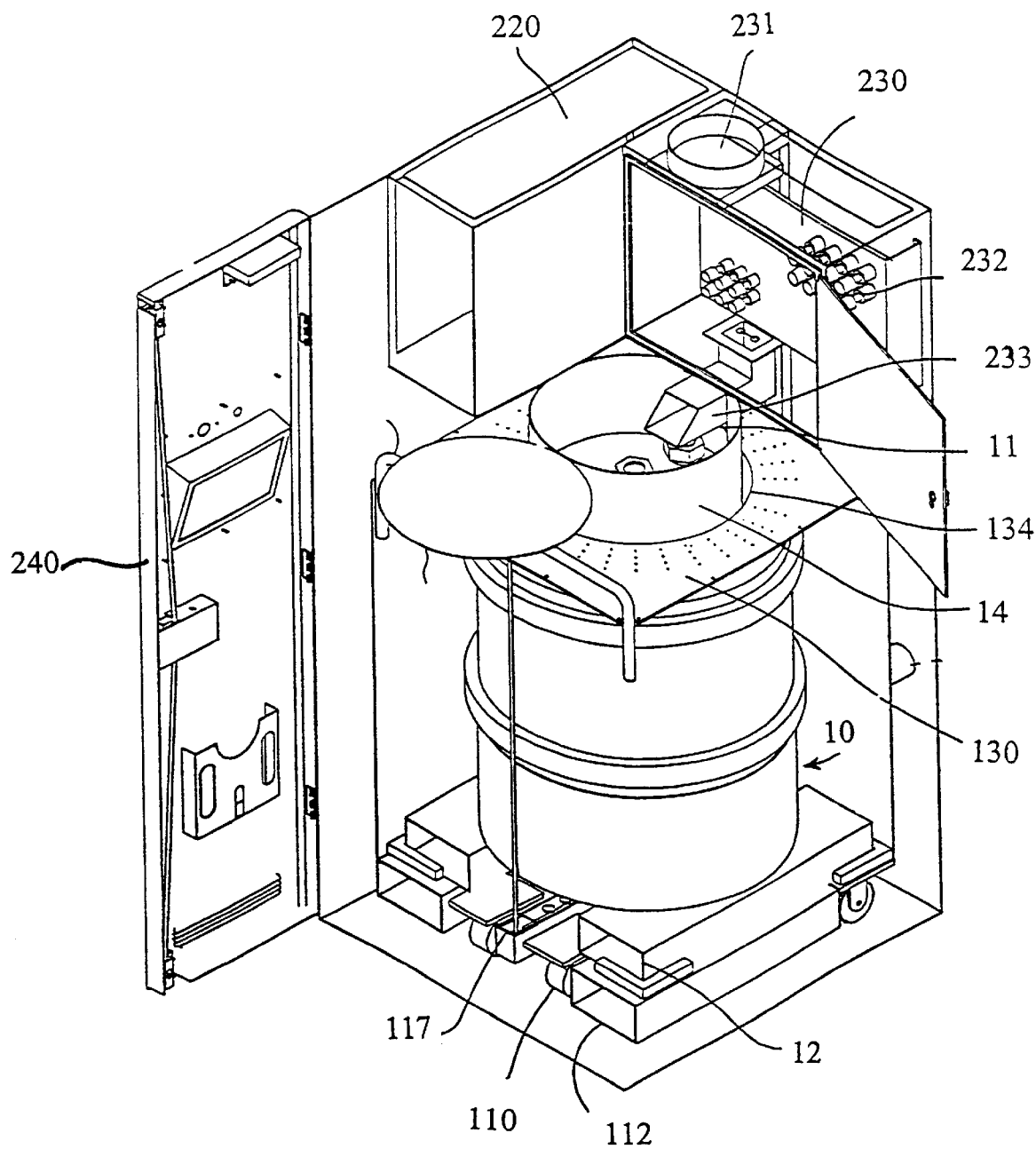
FIG. 3 shows a cabinet which houses a cart having a tank installed therein.

FIG. 3 illustrates tank 10 when placed in cart 100 which is housed in cabinet 200. FIG. 3 thus shows the configuration of the system of this invention. Canister 10 has been placed in crate 100 as by use of crane, with top 130 thereafter being secured onto crate 100, which thereby diminishes lateral movement and sway of tank 10. Canister 10 may be filled either before or after installation into cart 100. In FIG. 3, it can be seen that scoop 233 may be slid through hole 11 in vertical sheath 14 such that "pigtails" (i.e., manifold lines) may be protected from abrasion from the edge of hole 11. A spring loaded lifting device may also be employed to automatically lift the pigtails when disconnected. It can also be seen that vertical sheath 14, which protects fittings 13 during handling, fits in hole 134 of perforated crate top 130.

The canister 10 may be placed in cart 100 by lifting the canister 10, and moving and placing the tank 10 in crate 100. The crate 100 containing the tank 10 may be conveniently moved by simply pushing by hand, since the crate 100 is equipped with heavy duty wheels (rollers) 110. Advantageously, the cart 100 may be pushed into storage and delivery cabinet 200. As depicted in FIG. 1, the cabinet 200 and cart 100 are configured with guides 114 and 214 to assist the operator in placing the cart 100 into cabinet 200. An advantage of the present invention is that since the movable cart 100 functions to contain a spill should it occur, cabinet 200 is reduced in size relative to a conventional cabinet since the grating/reservoir is not needed. In addition, the tank 10 need not be lifted or raised in order to install it as in a conventional cabinet, since no grating and reservoir is housed within the cabinet. The cabinet and movable self-containment system of this invention thus requires less space while nonetheless providing containment. When the systems of this invention are employed in a cleanroom environment, a forklift is advantageously not needed to place a large canister in the cabinet. This is especially advantageous because cleanroom forklifts are rare, very expensive, and require a large area and clearance in the area of the cabinet to place the canister inside.

The types of chemicals which may be transferred using the bulk delivery system of this invention may vary widely depending on the type of process tool and desired outcome. Non-limiting examples of representative chemicals include tetraethylorthosilicate ("TEOS"), triethylphosphate, trimethyl phosphite, trimethyl borate, titanium tetrachloride, tantalum compounds, and the like; solvents such as chlorinated hydrocarbons, ketones such as acetone and methylethylketone, esters such as ethyl acetate, hydrocarbons, glycols, ethers, hexamethyldisilazane ("HMDS"), and the like; solid compounds dispersed in a liquid such as barium/strontium/titanate cocktails (mixtures). If the chemical being delivered is solid suspended in an organic liquid, the manifold may be designed so as to allow for liquid flush of all the lines to prevent solids accumulating in the lines upon evaporation of the organic liquid. If dispersions are employed, it is preferable to flush the lines out with liquid solvents such as triglyme or tetrahydrofuran (THF) so that compounds are not precipitated in the lines when the lines are depressurized. These examples of chemicals are not intended to be limiting in any way. The chemicals may be of a variety of purities, and mixtures of chemicals can be used. In one embodiment, a single type of chemical is employed. A given chemical may advantageously have a purity of 99.999% or more with respect to trace metals.

Further modifications and alternative embodiments of this invention will be apparent to those skilled in the art in view of this description. Accordingly, this description is to be construed as illustrative only and is for the purpose of teaching those skilled in the art the manner of carrying out the invention. It is to be understood that the forms of the invention herein shown and described are to be taken as presently preferred embodiments. Equivalent elements may be substituted for those illustrated and described herein, and certain features of the invention may be utilized independently of the use of other features, all as would be apparent to one skilled in the art after having the benefit of this description of the invention.

What is claimed is:

1. A chemical refill system, comprising a canister housed in a transportation cart,
wherein the cart comprises
a base having four sides that defines a scaled compartment,
wheels attached to the base,
a top attached to the sides having a canister hole, wherein the top has been fastened to the sides such that the canister hole fits over a vertical sheath on the canister, and wherein the top is perforated with holes smaller in diameter than the canister hole.

2. The system of claim 1, wherein the cart includes sleeves adapted to receive forks of a forklift.

3. The system of claim 1, wherein a guide member is attached to the base.

4. The system of claim 1, wherein a liquid sensor is positioned internal to the cart and near the base.

5. The system of claims 1, wherein a handle is attached to the cart.

6. The system of claim 1 which has been placed in a chemical delivery cabinet which comprises:
a base, three sides, and one or more doors attached to one or more sides,
a valve manifold affixed to an inner wall of the cabinet,
process control instrumentation which connects to and controls the valve manifold,
wherein at least one of the doors has a touch control pad mounted thereon.

7. The system of claim 6, wherein the process control instrumentation is housed in a compartment mounted to one or more internal walls of the cabinet.

8. The system of claim 6, wherein a scoop is connected to the valve manifold.

9. The system of claim 6, wherein a guide member is part of the base of the cabinet.

10. The system of claim 6, wherein the cabinet includes an exhaust outlet on top of the cabinet.

11. The system of claim 6, wherein the cabinet includes lines which connect the tank to the valve manifold.

12. A process useful for supplying a refill canister comprising:

providing a cart which comprises
        a base having four sides,
        wheels attached to the base,
        a top attached to the sides having a canister hole, wherein the top has been fastened to the sides,
        wherein the base, sides, and doors have been attached to provide a sealed compartment, and
        wherein the top is perforated with holes smaller in diameter than the canister hole;
    providing a canister;
    placing the canister in the cart such that the canister hole fits over a vertical sheath on the canister; and
    filling the canister with a liquid chemical before or after placing the canister in the cart.

13. The process of claim 12, wherein the chemical is tetraethylorthosilicate.

14. The process of claim 12, wherein the chemical is 99.9999% or more pure based on trace metals.

15. The process of claim 12, further comprising placing the cart in a cabinet, wherein the cabinet comprises:

a base, three sides, and one or more doors attached to one or more sides,
    a valve manifold affixed to an inner wall of the cabinet,
    process control instrumentation which connects to and controls the valve manifold,
    wherein at least one of the doors has a touch control pad mounted thereon.

16. A chemical refill system, comprising a canister housed in a transportation cart, wherein the cart comprises
    a base having four sides that defines a sealed compartment,
    wheels attached to the base,
    a top attached to the sides having a canister hole, wherein the top has been fastened to the sides such that the canister hole fits over a vertical sheath on the canister, and wherein a liquid sensor is positioned internal to the cart and near the base.

17. A chemical refill system, comprising a canister housed in a transportation cart, wherein the cart comprises
    a base having four sides that defines a sealed compartment,
    wheels attached to the base,
    a top attached to the sides having a canister hole, wherein the top has been fastened to the sides such that the canister hole fits over a vertical sheath on the canister, and wherein a handle is attached to the cart.

* * * * *

UNITED STATES PATENT AND TRADEMARK OFFICE
CERTIFICATE OF CORRECTION

PATENT NO. : 6,029,718
DATED : FEBRUARY 29, 2000
INVENTOR(S) : Jackson, et al.

It is certified that error appears in the above-identified patent and that said Letters Patent is hereby corrected as shown below:

Column 6, line 37 change " scaled" to --sealed--

Signed and Sealed this

Third Day of April, 2001

Attest:

NICHOLAS P. GODICI

Attesting Officer

Acting Director of the United States Patent and Trademark Office